(12) United States Patent
Kuramochi et al.

(10) Patent No.: US 8,068,047 B2
(45) Date of Patent: Nov. 29, 2011

(54) A-D CONVERT APPARATUS AND CONTROL METHOD

(75) Inventors: Yasuhide Kuramochi, Gunma (JP);
Masayuki Kawabata, Saitama (JP);
Kouichiro Uekusa, Miyagi (JP)

(73) Assignee: Advantest Corporation, Tokyo (JP)

( * ) Notice: Subject to any disclaimer, the term of this patent is extended or adjusted under 35 U.S.C. 154(b) by 35 days.

(21) Appl. No.: 12/687,525

(22) Filed: Jan. 14, 2010

(65) Prior Publication Data

US 2011/0169674 A1    Jul. 14, 2011

(51) Int. Cl.
*H03M 1/12*    (2006.01)

(52) U.S. Cl. ........................................ 341/172; 341/155

(58) Field of Classification Search .................. 341/118, 341/120, 156, 155, 172; 327/94, 337
See application file for complete search history.

(56) References Cited

U.S. PATENT DOCUMENTS

| | | | | |
|---|---|---|---|---|
| 5,581,252 | A | * | 12/1996 | Thomas ........................ 341/144 |
| 5,675,340 | A | * | 10/1997 | Hester et al. .................. 341/156 |
| 6,400,302 | B1 | | 6/2002 | Amazeen et al. |
| 6,897,801 | B2 | * | 5/2005 | Confalonieri et al. ........ 341/172 |

* cited by examiner

*Primary Examiner* — Brian Young
(74) *Attorney, Agent, or Firm* — Chen Yoshimura LLP

(57) ABSTRACT

Provided is an AD conversion apparatus including: a differential amplifier that generates a differential input voltage according to an analog input signal; a differential DA converter of a charge redistribution type, which outputs a differential output voltage resulting from subtracting the differential input voltage from a differential comparison voltage that is in accordance with comparison data; a comparator that compares a positive output voltage and a negative output voltage in the differential output voltage; a control section that identifies the comparison data at which the differential output voltage becomes substantially 0 based on a comparison result of the comparator, and outputs the identified comparison data as output data; and a setting section that sets at least one of a common potential of the differential amplifier and a common potential of the differential DA converter, according to a targeted value of a common potential of the comparator

12 Claims, 10 Drawing Sheets

US 8,068,047 B2

A-D CONVERT APPARATUS AND CONTROL METHOD

BACKGROUND

1. Technical Field

The present invention relates to an AD conversion apparatus and a control method.

2. Related Art

The S/N ratio of a successive approximation AD converter depends on the accuracy of its internal comparator. The magnitude of the noise generated by the comparator depends on the common potential of the input end of the comparator. Therefore, the S/N ratio of a successive approximation AD converter can be improved by setting the common potential of its internal comparator to an optimal value.

An successive approximation AD converter equipped with a charge redistribution type differential DA converter is already known (Patent Document No. 1). This type of AD converters uses a comparator to compare a positive voltage with a negative voltage in the differential output voltage outputted from the differential DA converter in the successive approximation, thereby detecting DAC data at which the differential output voltage becomes substantially 0.

Patent Document No. 1: U.S. Pat. No. 6,400,302

The differential DA converter outputs a differential output voltage that changes between the positive side and the negative side with the common potential as the center. Therefore, the differential DA converter can maximize the dynamic range of the differential output voltage by setting the midpoint potential of the positive reference potential and the negative reference voltage to the common potential.

In a successive approximation AD converter having such a differential DA converter, however, the comparator compares the positive voltage and the negative voltage in the differential output voltage outputted from the differential DA converter. Therefore, when changing the common potential of the comparator for the purpose of reducing the noise from the comparator, the common potential of the differential DA converter should be changed as well. For this reason, with a successive approximation AD converter equipped with a differential DA converter, it has been difficult to reduce the noise from the comparator as well as widening the dynamic range of the differential DA converter.

SUMMARY

According to a first aspect related to the innovations herein, one exemplary apparatus and method is an AD conversion apparatus including: a differential amplifier that generates a differential input voltage according to an analog input signal; a differential DA converter of a charge redistribution type, which outputs a differential output voltage resulting from subtracting the differential input voltage from a differential comparison voltage that is in accordance with comparison data; a comparator that compares a positive output voltage and a negative output voltage in the differential output voltage; a control section that identifies the comparison data at which the differential output voltage becomes substantially 0 based on a comparison result of the comparator, and outputs the identified comparison data as output data; and a setting section that sets at least one of a common potential of the differential amplifier and a common potential of the differential DA converter, according to a targeted value of a common potential of the comparator, and a control method of the AD conversion apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
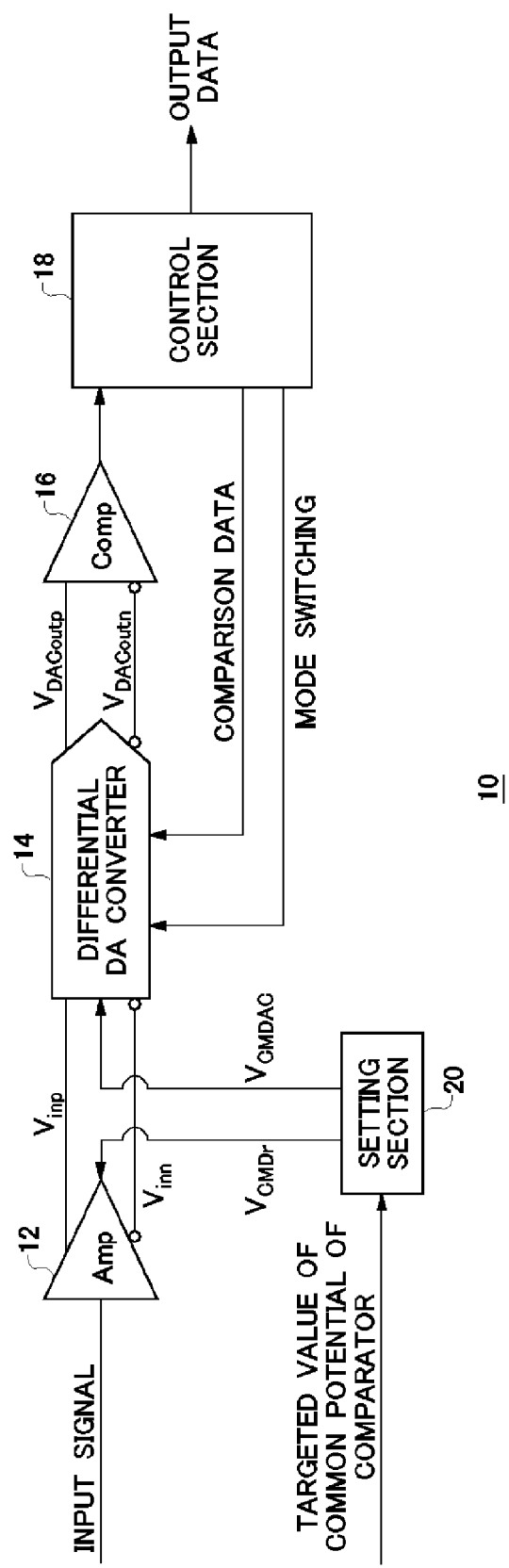
FIG. 1 shows a configuration of an AD conversion apparatus 10 according to the present embodiment.

FIG. 1 shows a configuration of an AD conversion apparatus 10 according to the present embodiment. The AD conversion apparatus 10 according to the present embodiment outputs digital output data according to an analog input signal in each predetermined sampling period. The AD conversion apparatus 10 includes a differential amplifier 12, a differential DA converter 14, a comparator 16, a control section 18, and a setting section 20.

The differential amplifier 12 receives an analog input signal, and generates a differential input voltage according to the received analog input signal. Specifically, the differential amplifier 12 outputs, as a differential input voltage, a positive input voltage ($V_{inp}$) and a negative input voltage ($V_{inn}$) that is an inverse of the positive input voltage ($V_{inp}$) with respect to a common potential ($V_{CMDr}$) of the differential amplifier 12. Note that the differential amplifier 12 may receive a differential input signal or a single-end input signal.

The differential DA converter 14 receives a differential input voltage from the differential amplifier 12. In addition, the differential DA converter 14 receives comparison data from the control section 18. The differential DA converter 14 is a charge redistribution type, and outputs a differential output voltage resulting from subtracting the differential input voltage from a differential comparison voltage that is in accordance with the comparison data.

To be more specific, the differential DA converter 14 operates by switching between a sample mode and a hold mode. In the sample mode, the differential DA converter 14 samples the positive input voltage ($V_{inp}$) and the negative input voltage ($V_{inn}$) respectively. In other words, in the sample mode, the differential DA converter 14 charges the internal capacitor with the positive input voltage ($V_{inp}$) and the negative input voltage ($V_{inn}$) respectively.

The differential DA converter 14 is provided with the comparison data from the control section 18, in the hold mode. In the hold mode, the differential DA converter 14 outputs a positive output voltage ($V_{DACoutp}$) resulting from subtracting the positive input voltage ($V_{inp}$) sampled in the sample mode, from the positive comparison voltage that is in accordance with the comparison data. In the hold mode, the differential DA converter 14 also outputs a negative output voltage ($V_{DACoutm}$) resulting from subtracting the negative input voltage ($V_{inn}$) sampled in the sample mode, from the negative comparison voltage that is in accordance with the comparison data (i.e. the negative comparison voltage being an inverse of the positive comparison voltage with respect to a common potential ($V_{CMDAC}$) of the differential DA converter 14).

The comparator 16 compares the positive output voltage ($V_{DACoutp}$) and the negative output voltage ($V_{DACoutm}$), in the differential output voltage outputted from the differential DA converter 14. That is, the comparator 16 determines which of the positive output voltage ($V_{DACoutp}$) and the negative output voltage ($V_{DACoutm}$) is larger. The comparator 16 outputs the comparison result to the control section 18.

The control section 18 switches the operation mode of the differential DA converter 14. To be more specific, in a sampling period, the control section 18 first brings the differential DA converter 14 in the sample mode, and then brings the differential DA converter 14 in the hold mode.

The control section 18, during the hold mode of the differential DA converter 14, performs successive approximation based on the comparison result of the comparator 16, and identifies the comparison data at which the differential output voltage becomes substantially 0. That is, the control section 18 identifies the comparison data at which the differential comparison voltage substantially equal to the differential input voltage is generated.

Here, the differential output voltage of substantially 0 may not strictly be a differential voltage having a value of 0. For example, the control section 18 identifies comparison data at which the differential output voltage can be smaller than a voltage corresponding to the minimum bit width of the differential DA converter 14. The control section 18 outputs the identified comparison data, as the output data in the particular sampling period.

The setting section 20 sets at least one of the common potential ($V_{CMDr}$) of the differential amplifier 12 and the common potential ($V_{CMDAC}$) of the differential DA converter 14, in accordance with the targeted value of the common potential of the comparator 16 received from outside, for example. That is, the setting section 20 sets at least one of common potential ($V_{CMDr}$) of the differential amplifier 12 and the common potential ($V_{CMDAC}$) of the differential DA converter 14, so that the common potential ($V_{CMcompin}$) of the comparator 16 becomes equal to the targeted value.

In this case, the setting section 20 sets common potential ($V_{CMDr}$) of the differential amplifier 12 and the common potential ($V_{CMDAC}$) of the differential DA converter 14, to different potentials from each other. According to this arrangement, the setting section 20 can reduce the noise from the comparator 16, as well as adjusting the dynamic range of the differential DA converter 14 to an arbitrary range. Note that the exemplary concrete configuration of the setting section 20 is detailed later.

Figure 2:
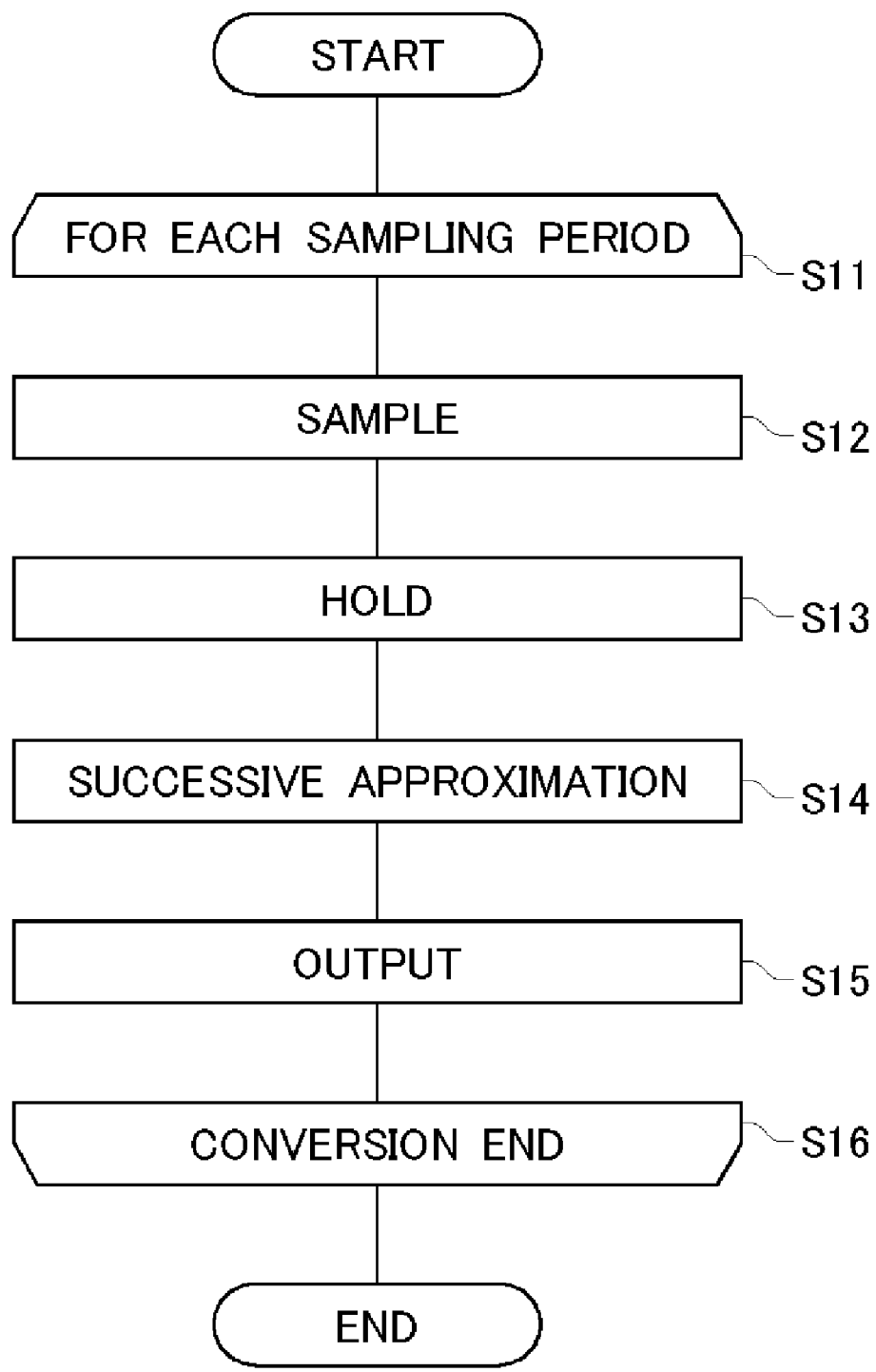
FIG. 2 shows an operational flow of a control section 18 according to the present embodiment.

FIG. 2 shows an operational flow of a control section 18 according to the present embodiment. The control section 18 repeatedly performs the processing from Step S12 through Step S15 (loop processing between S11 and S16), in each sampling period.

In a sampling period, the control section 18 first brings the differential DA converter 14 to a sample mode (S12). Then, the differential DA converter 14 samples the differential input voltage outputted from the differential amplifier 12.

Next, the control section 18 brings the differential DA converter 14 to a hold mode (S13). Then, the differential DA converter 14 is brought in a state where it can obtain a differential output voltage resulting from subtracting the differential input voltage sampled in the sample mode from the differential comparison voltage that is in accordance with the comparison data inputted from the control section 18.

Next, the control section 18 performs successive approximation during the hold mode of the differential DA converter 14. That is, the control section 18 identifies the comparison data at which the differential output voltage becomes substantially 0 based on the comparison result of the comparator 16, by sequentially varying the comparison data. In this process, the control section 18 can identify the comparison data at which the differential output voltage efficiently becomes substantially 0, by varying the comparison data according to a binary search, for example.

Next, the control section 18 outputs the identified comparison data in Step S14, as the output data in the particular sampling period. Note that the control section 18 may output this output data of the sample period, later than this sample period.

The control section 18 repeats the above-stated processing from Step S12 through Step S15, until reception of an instruction to end the conversion (S16). Accordingly, the AD conversion apparatus 10 can output a data sequence resulting from sampling analog input signals in each sampling period.

Figure 3:
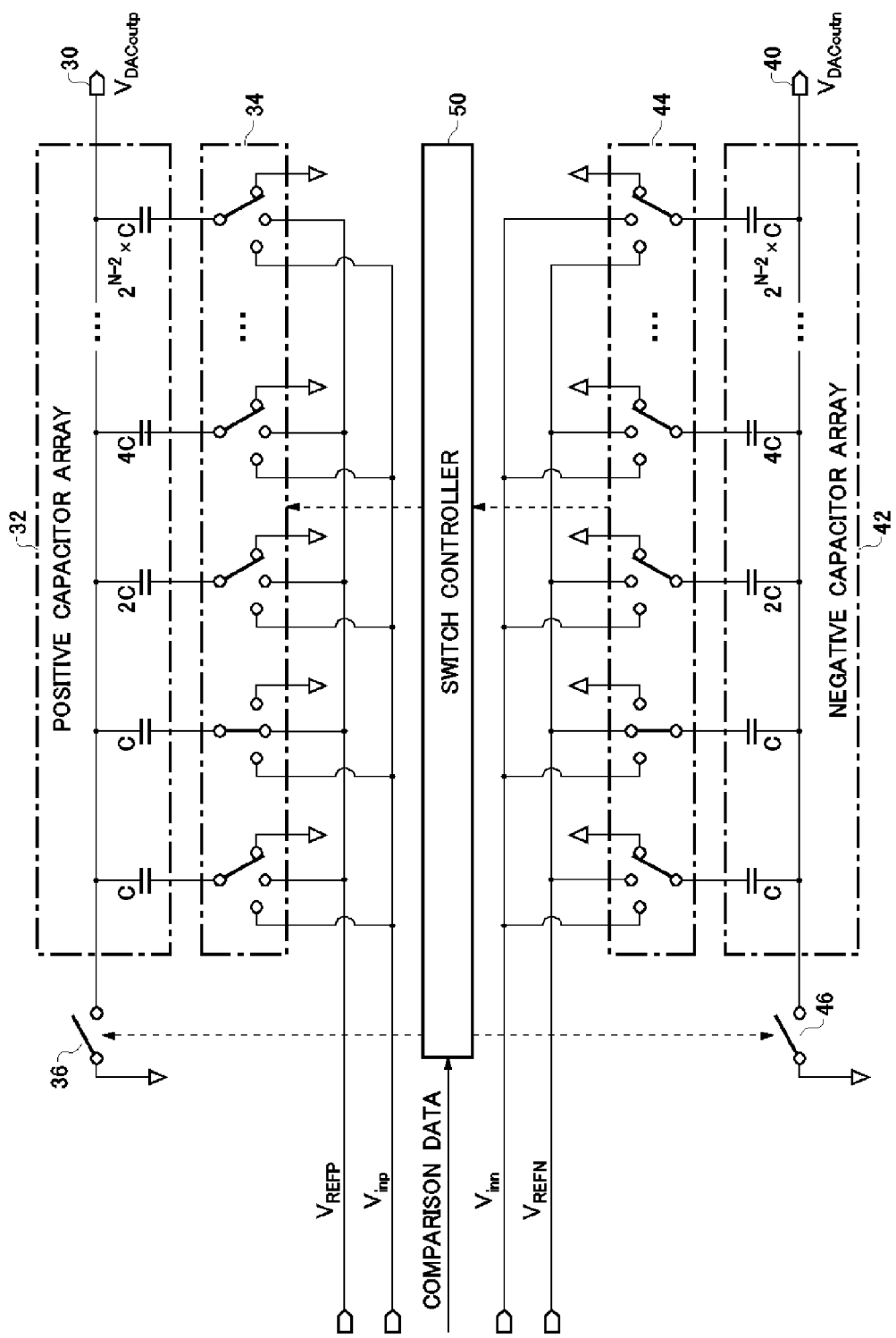
FIG. 3 shows an exemplary configuration of a differential DA converter 14 according to the present embodiment.

FIG. 3 shows an exemplary configuration of the differential DA converter 14 according to the present embodiment. The differential DA converter 14 generates a positive output voltage ($V_{DACoutp}$) from a positive output end 30, and a negative output voltage ($VDA_{Coutm}$) from a negative output end 40.

In addition, the differential DA converter 14 is provided with a positive reference potential ($V_{REFP}$) and a negative reference potential ($V_{REFN}$), for example from the reference power source. The common potential ($V_{CMDAC}$) of the differential DA converter 14 is a potential between the positive reference potential ($V_{REFP}$) and the negative reference potential ($V_{REFN}$), and preferably a midpoint potential between the positive reference potential ($V_{REFP}$) and the negative reference potential ($V_{REFN}$). Note that in FIG. 3, the common potential ($V_{CMDAC}$) of the differential DA converter 14 is represented as ∇ or Δ (triangular) marks.

The differential DA converter 14 includes a positive capacitor array 32, a positive switch 34, a positive sampling switch 36, a negative capacitor array 42, a negative switch 44, a negative sampling switch 46, and a switch controller 50.

The positive capacitor array 32 includes a plurality of capacitors, and has an end connected to the positive output end 30. The positive capacitor array 32 includes N capacitors weighted such as C, $2^1*C$, $2^2*C$, $2^4*C$, $2^8*C$, ...$2^{N-2}*C$ (where N is an integer greater than or equal to 2), and one end of each of the N capacitors is connected to the positive output end 30 and in parallel to one another. Note that "C" represents a unit capacity for the weight of 1 bit.

The positive switch 34 switches the connection of the positive capacitor array 32, according to the control by the control section 18. The positive switch 34 includes N switches provided to be associated with the N capacitors in the positive capacitor array 32, for example.

In the sample mode, the positive switch 34 connects the end of the positive capacitor array 32, not connected to the positive output end 30, to the input end of the positive input voltage ($V_{inp}$). For example, the positive switch 34 may connect each of the ends of the N capacitors, which are not connected to the positive output end 30, to the input end of the positive input voltage ($V_{inp}$).

In addition, in the hold mode, the positive switch 34 divides, into two, the plurality of capacitors included in the positive capacitor array 32, in a capacity ratio according to the comparison data. Then, the positive switch 34 connects the ends of the first half group of the capacitors resulting from the division, which are not connected to the positive output end 30, to the positive reference potential ($V_{REFP}$), and the ends of the other half group of the capacitors, which are not connected to the positive output end 30, to the common potential ($V_{CMDAC}$).

The positive sampling switch 36 switches whether to connect the positive output end 30 to the common potential ($V_{CMDAC}$). Specifically, the positive sampling switch 36 connects between the positive output end 30 and the common potential ($V_{CMDAC}$) in the sample mode, and disconnect the connection in the hold mode.

The negative capacitor array 42 includes a plurality of capacitors, and has an end connected to the negative output end 40. The negative capacitor array 42 includes N capacitors having the same capacity and connection as those of the positive capacitor array 32.

The negative switch 44 switches the connection of the negative capacitor array 42, according to the control of the control section 18. The negative switch 44 includes N switches provided to be associated with the N capacitors in the negative capacitor array 42, for example.

In the sample mode, the negative switch 44 connects the end of the negative capacitor array 42, which is not connected to the negative output end 40, to the input end of the negative input voltage ($V_{inn}$). For example, the negative switch 44 may connect each of the ends of the N capacitors, not connected to the negative output end 40, to the input end of the negative input voltage ($V_{inn}$).

In addition, in the hold mode, the negative switch 44 divides, into two, the plurality of capacitors included in the negative capacitor array 42, in a capacity ratio according to the comparison data. Then, the negative switch 44 connects the ends of the first half group of the capacitors resulting from the division, which are not connected to the negative output end 40, to the negative reference potential ($V_{REFN}$), and the other half group of the capacitors, which are not connected to the negative output end 40, to the common potential ($V_{CMDAC}$).

The negative sampling switch 46 switches whether to connect the negative output end 40 to the common potential ($V_{CMDAC}$). Specifically, the negative sampling switch 46 connects between the negative output end 40 and the common potential ($V_{CMDAC}$) in the sample mode, and disconnect the connection in the hold mode.

The switch controller 50 receives comparison data and a mode switch instruction from the control section 18. The switch controller 50 switches the state of the positive switch 34, the negative switch 44, the positive sampling switch 36, and the negative sampling switch 46, according to the comparison data and the mode switch instruction.

Figure 4:
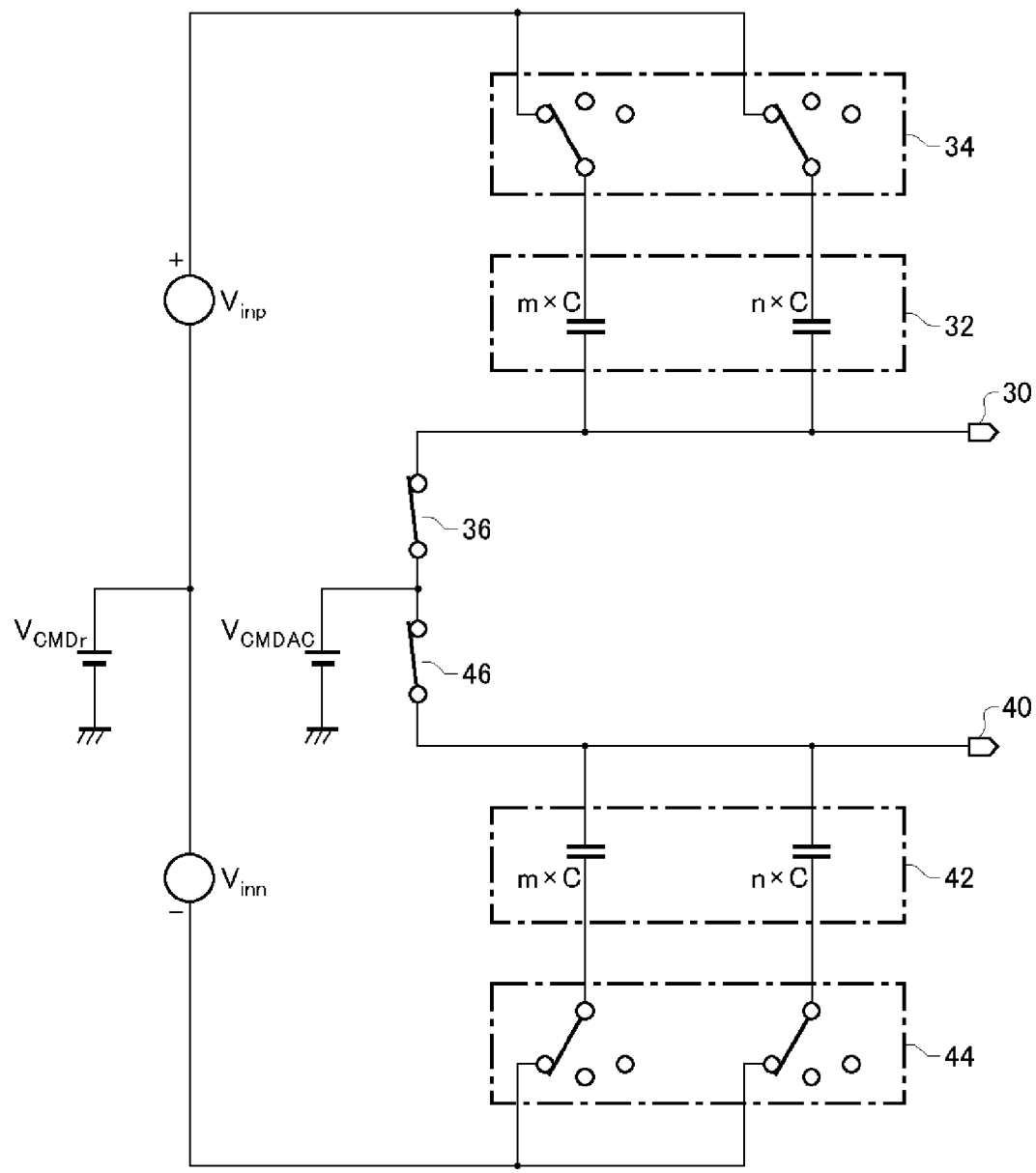
FIG. 4 shows an equivalent circuit in a sample mode of the differential DA converter 14 according to the present embodiment.
Figure 5:
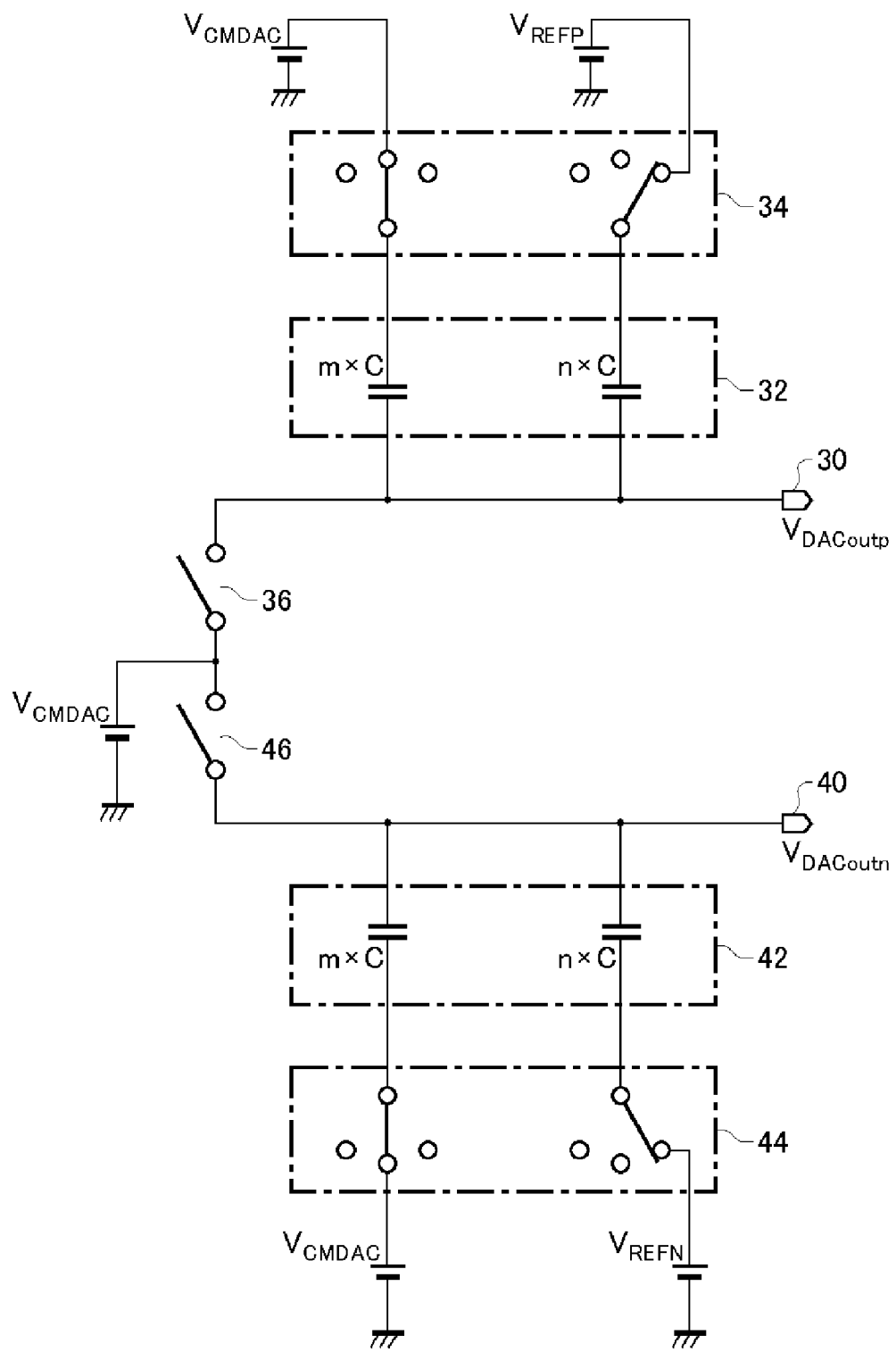
FIG. 5 shows an example of the equivalent circuit during successive approximation in a hold mode of the differential DA converter 14 according to the present embodiment.

FIG. 4 shows an equivalent circuit in a sample mode of the differential DA converter 14 according to the present embodiment. FIG. 5 shows an example of the equivalent circuit during successive approximation in a hold mode of the differential DA converter 14 according to the present embodiment. Note that the resolution of the differential DA converter 14 is represented as (m+n). The ratio of the value of the comparison data with respect to the full scale value of the differential DA converter 14 is represented as m/(n+m). The unit capacity of the differential DA converter 14 for the weight of 1 bit is represented as C.

As shown in FIG. 4, in the sample mode, the differential DA converter 14 connects the positive output end 30 to the common potential ($V_{CMDAC}$) of the differential DA converter 14, and charges the positive capacitor array 32 with the positive input voltage ($V_{inp}$) where the common potential ($V_{CMDr}$) of the differential amplifier 12 is offset. By doing so, the differential DA converter 14 can generate, from the positive output end 30, an inverse voltage of the voltage summation of the common potential ($V_{DMr}$) of the differential amplifier 12 and the positive input voltage ($V_{inp}$), when the positive output end 30 is disconnected from the common potential ($V_{CMDAC}$) of the differential DA converter 14.

In the sample mode, the differential DA converter 14 also connects the negative output end 40 to the common potential ($V_{CMDAC}$) of the differential DA converter 14 itself, as shown in FIG. 4, to charge the negative capacitor array 42 with the negative input voltage ($V_{inn}$) where the common potential ($V_{CMDr}$) of the differential amplifier 12 is offset. By doing so, the differential DA converter 14 can generate, from the negative output end 40, an inverse voltage of the voltage summation of the common potential ($V_{CMDr}$) of the differential amplifier 12 and the negative input voltage ($V_{inn}$), when the negative output end 40 is disconnected from the common potential ($V_{CMDAC}$) of the differential DA converter 14.

Next, as shown in FIG. 5, in the hold mode, the differential DA converter 14 disconnects the positive output end 30 and the negative output end 40, from the common potential ($V_{CMDAC}$). Furthermore, in the hold mode, the differential DA converter 14 switches the ratio between the capacity between the positive output end 30 and the common potential ($V_{CMDAC}$), and the capacity between the positive output end 30 and the positive reference potential ($V_{REFP}$) in the positive capacitor array 32, according to the comparison data.

To be more specific, the differential DA converter 14 connects the capacity of m*C from the positive capacitor array 32, between the positive output end 30 and the common potential ($V_{CMDAC}$). Then, the differential DA converter 14 connects the capacity of n*C from the positive capacitor array 32, between the positive output end 30 and the positive reference potential ($V_{REFP}$). Accordingly, the differential DA converter 14 can generate, from the positive output end 30, the voltage (positive comparison voltage) resulting from dividing the positive reference potential ($V_{REFP}$) and the common potential ($V_{CMDAC}$) in a capacity ratio according to the comparison data.

In the hold mode, the differential DA converter 14 switches the ratio between the capacity between the negative output end 40 and the common potential ($V_{CMDAC}$) and the capacity between the negative output end 40 and the negative reference potential ($V_{REFN}$) in the negative capacitor array 42, according to the comparison data, as shown in FIG. 5. To be more specific, the differential DA converter 14 connects the capacity of m*C from the negative capacitor array 42, between the negative output end 40 and the common potential ($V_{CMDAC}$). Then, the differential DA converter 14 connects the capacity of n*C from the negative capacitor array 42, between the negative output end 40 and the negative reference potential ($V_{REFN}$). Accordingly, the differential DA converter 14 can generate, from the negative output end 40, the voltage (negative comparison voltage) resulting from dividing the negative reference potential ($V_{REFN}$) and the common potential ($V_{CMDAC}$) in a capacity ratio according to the comparison data.

As explained above, in the hold mode, the differential DA converter 14 can output the positive output voltage ($V_{DACoutp}$) resulting from subtracting the voltage used to charge the positive capacitor array 32 in the sample mode (i.e. the voltage corresponding to the positive input voltage ($V_{inp}$) where the common potential ($V_{CMDr}$) of the differential amplifier 12 is offset) from the positive comparison voltage that is in accordance with the comparison data. Also in the hold mode, the differential DA converter 14 can output the negative output voltage ($V_{DACoutn}$) resulting from subtracting the voltage used to charge the negative capacitor array 42 in the sample mode (i.e. the voltage corresponding to the negative input voltage ($V_{inn}$) where the common potential ($V_{CMDr}$) of the differential amplifier 12 is offset) from the negative comparison voltage that is in accordance with the comparison data.

That is, the differential DA converter 14 can output the positive output voltage ($V_{DACoutp}$) and the negative output voltage ($V_{DACoutn}$) shown in the following expression (1), from the positive output end 30 and the negative output end 40.

$$\begin{cases} v_{DACoutp} = \frac{n}{m+n}V_{REFP} + \left(\frac{m}{m+n}+1\right)V_{CMDAC} - V_{CMDr} - v_{inp} \\ v_{DACoutn} = \frac{n}{m+n}V_{REFN} + \left(\frac{m}{m+n}+1\right)V_{CMDAC} - V_{CMDr} - v_{inn} \end{cases} \quad (1)$$

Figure 6:
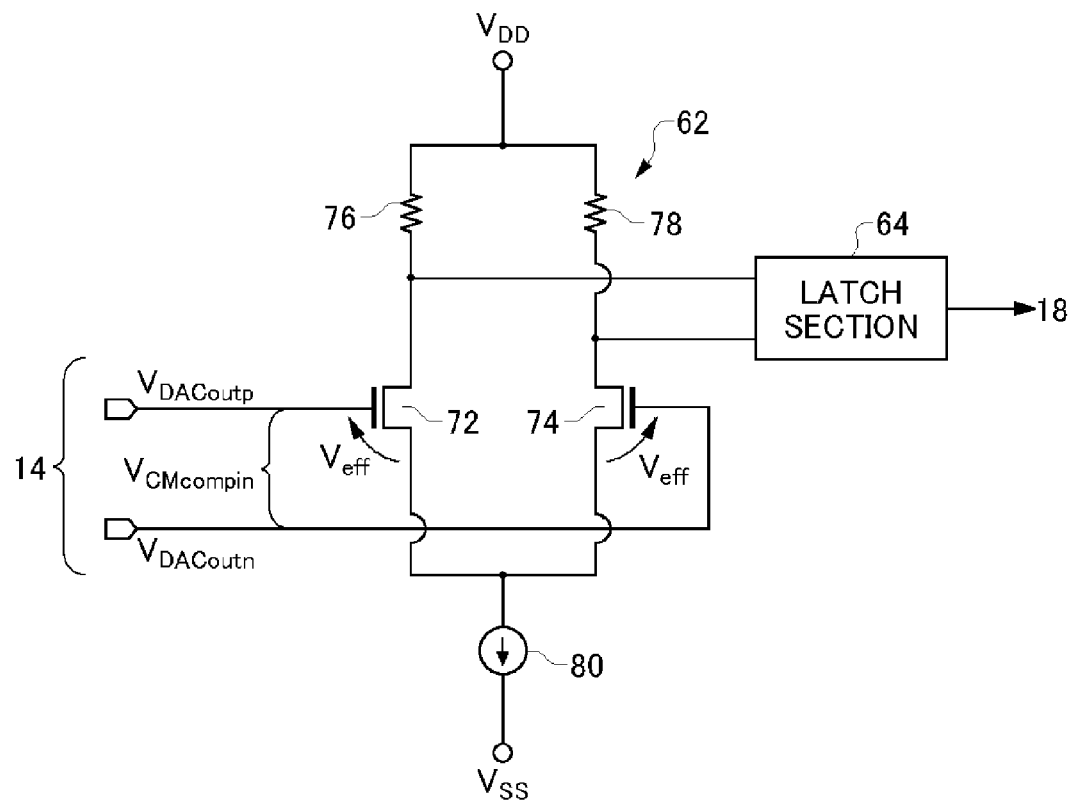
FIG. 6 shows an exemplary configuration of a comparator 16 according to the present embodiment.

FIG. 6 shows an exemplary configuration of a comparator 16 according to the present embodiment. The comparator 16 includes a differential amplifier 62 and a latch section 64, for example.

The differential amplifier 62 performs differential amplification on the differential output voltage (i.e. the positive output voltage ($V_{DACoutp}$) and the negative output voltage ($V_{DACoutn}$)) outputted from the differential DA converter 14. Here, the differential DA converter 14 performs amplification utilizing a comparatively large amplification factor. For example, even when the differential output voltage is smaller than the output voltage corresponding to 1 bit of the differential DA converter 14, the differential DA converter 14 amplifies the differential output voltage to a voltage whose logical value is at least obtainable by the latch section 64 at the later stage.

The latch section 64 obtains the output voltage from the differential amplifier 62 as a logical value, and retains the obtained logical value. The comparator 16 then outputs the retained logical value to the control section 18, as a comparison result showing which of the positive output voltage ($V_{DACoutp}$) and the negative output voltage ($V_{DACoutn}$) is larger.

For example, the differential amplifier 62 includes a positive transistor 72, a negative transistor 74, a positive output resistance 76, a negative output resistance 78, and a constant current source 80. The positive transistor 72 and the negative transistor 74 are the same type of FET as each other, for example. The positive output resistance 76 and the negative output resistance 78 have an equal resistance value to each other.

The gate of the positive transistor 72 is connected to the input end of the positive output voltage ($V_{DACoutp}$), and the drain thereof is connected to the drain power source ($V_{DD}$) via the positive output resistance 76. The gate of the negative transistor 74 is connected to the input end of the negative output voltage ($V_{DACoutn}$), and the drain thereof is connected to the drain power source ($V_{DD}$) via the negative output resistance 78.

The source of the positive transistor 72 and the source of the negative transistor 74 are commonly connected to the constant current source 80. In the stated differential amplifier 62, the positive transistor 72 and the negative transistor 74 perform inversed operations from each other, to perform differential amplification on the differential output voltage (i.e. the positive output voltage ($V_{DACoutp}$) and the negative output voltage ($V_{DACoutn}$)).

Here, the stated comparator 16 is known to cause noise of different magnitudes according to the effective voltage (Veff) of the differential amplifier 62. Thus, the comparator 16 can restrain noise by setting the effective voltage (Veff) of the differential amplifier 62 to an optimal value by changing it.

The following expression (1) shows the differential output voltage (the positive output voltage ($V_{DACoutp}$) and the negative output voltage ($V_{DACoutn}$)) supplied to the comparator 16.

$$\begin{cases} v_{DACoutp} = \frac{n}{m+n}V_{REFP} + \left(\frac{m}{m+n}+1\right)V_{CMDAC} - V_{CMDr} - v_{inp} \\ v_{DACoutn} = \frac{n}{m+n}V_{REFN} + \left(\frac{m}{m+n}+1\right)V_{CMDAC} - V_{CMDr} - v_{inn} \end{cases} \quad (1)$$

The differential DA converter 14 is designed so that the positive reference potential ($V_{REFP}$), the negative reference potential ($V_{REFN}$), and the common potential ($V_{CMDAC}$) satisfy the relation represented in the following expression (2), for example.

$$V_{CMDAC} = \frac{V_{REFP} + V_{REFN}}{2} \quad (2)$$

In addition, since the positive input voltage ($V_{inp}$) and the negative input voltage ($V_{inn}$) inputted to the differential DA converter 14 constitute a differential voltage, they satisfy the relation represented in the expression (3).

$$v_{inp} + v_{inn} = 0 \quad (3)$$

The common potential ($V_{CMcompin}$) of the comparator 16 is a midpoint potential between the potential at the positive input end and the potential at the negative input end. Therefore, the common potential ($V_{CMcompin}$) of the comparator 16 is represented by the following expression (4), using the above expressions (1), (2), and (3).

$$V_{CMcompin} = \frac{v_{DACoutp} + v_{DACoutn}}{2} = 2V_{CMDAC} - V_{CMDr} \quad (4)$$

In addition, the differential output voltage ($V_{diffcompin}$) inputted to the comparator 16 is represented by the following expression (5).

$$\begin{aligned} v_{diffcompin} &= v_{DACoutp} - v_{DACoutn} \\ &= -(v_{inp} - v_{inn}) + \frac{n}{m+n}(V_{REFP} - V_{REFN}) \end{aligned} \quad (5)$$

The expression (5) does not include the common potential ($V_{CMcompin}$) of the comparator 16. From this, it can be understood that the common potential ($V_{CMcompin}$) of the comparator 16 is independently controllable from the differential output voltage ($V_{diffcompin}$) inputted to the comparator 16.

Here, the effective voltage (Veff) of the differential amplifier 62 is a value resulting from subtracting the threshold voltage ($V_T$) from the gate-source voltage ($V_{GS}$) of the FET in the input stage of the differential amplifier 62. The differential output voltage ($V_{diffcompin}$) inputted to the comparator 16 will eventually reach 0 by successive approximation. Therefore, the AD conversion apparatus 10 according to the present embodiment assumes that the gate-source voltage ($V_{GS}$) of the FET in the input stage of the differential amplifier 62 is equal to the common potential ($V_{CMcompin}$) of the comparator 16. From this, the effective voltage (Veff) of the differential amplifier 62 can be represented as the following expression (6).

$$V_{eff} = V_{GS} - V_T = V_{CMcompin} - V_T = 2V_{CMDAC} - V_{CMDr} - V_T \quad (6)$$

This expression (6) shows that the effective voltage (Veff) of the differential amplifier 62 changes by changing at least one of the common potential ($V_{CMDr}$) of the differential amplifier 12 and the common potential ($V_{CMDAC}$) of the differential DA converter 14. Therefore, the setting section 20 according to the present embodiment can reduce the noise from the comparator 16, by changing at least one of the common potential ($V_{CMDr}$) of the differential amplifier 12 and the common potential ($V_{CMDAC}$) of the differential DA converter 14.

The following explains the setting performed by the setting section 20. The setting section 20 receives the targeted value of the common potential of the comparator 16. For example, the setting section 20 receives, as the targeted value, the common potential ($V_{CMcompin}$) of the comparator 16 at which the noise from the comparator 16 can be reduced compared to the case of the common potential ($V_{CMDAC}$) of the differential DA converter 14. For example, the setting section 20 receives a targeted value calculated based on a measured value or a design value. The setting section 20 may receive the targeted value in either analog or digital format.

The setting section 20 sets at least one of the common potential ($V_{CMDr}$) of the differential amplifier 12 and the common potential ($V_{CMDAC}$) of the differential DA converter 14, in accordance with the targeted value of the common potential of the comparator 16. That is, the setting section 20 sets at least one of common potential ($V_{CMDr}$) of the differential amplifier 12 and the common potential ($V_{CMDAC}$) of the differential DA converter 14, so that the common potential ($V_{CMcompin}$) of the comparator 16 becomes equal to the targeted value.

In this case, the setting section 20 sets common potential ($V_{CMDr}$) of the differential amplifier 12 and the common potential ($V_{CMDAC}$) of the differential DA converter 14, to different potentials from each other. According to this arrangement, the setting section 20 can adjust the common potential ($V_{CMcompin}$) of the differential amplifier 12 to cause the common potential ($V_{CMcompin}$) of the comparator 16 to be equal to the targeted value, while fixing the common potential ($V_{CMDAC}$) of the differential DA converter 14 to maximize the dynamic range. The stated setting section 20 can reduce the noise from the comparator 16, without changing the dynamic range of the differential DA converter 14.

When setting the dynamic range of the differential DA converter 14 to the widest, the common potential ($V_{CMDAC}$) of the differential DA converter 14 is designed at the midpoint potential between the positive reference potential ($V_{REFP}$) and the negative reference potential ($V_{REFN}$). In this case, the relation among the common potential ($V_{CMcompin}$) of the comparator 16, the common potential ($V_{CMDAC}$) of the differential DA converter 14, and the common potential ($V_{CMDr}$) of the differential amplifier 12 satisfies the relation represented in the above expression (4).

Therefore, the setting section 20, for example, sets at least one of the common potential ($V_{CMDr}$) of the differential amplifier 12 and the common potential ($V_{CMDAC}$) of the differential DA converter 14, so that the potential resulting from subtracting the common potential ($V_{CMDr}$) of the differential amplifier 12 from the twice the value of the common potential ($V_{CMDAC}$) of the differential DA converter 14 is equal to the targeted value of the common potential of the comparator 16. As a result, the setting section 20 can cause the common potential ($V_{CMcompin}$) of the comparator 16 to be equal to the targeted value, under a condition that the dynamic range of the differential DA converter 14 is set wide.

Figure 7:
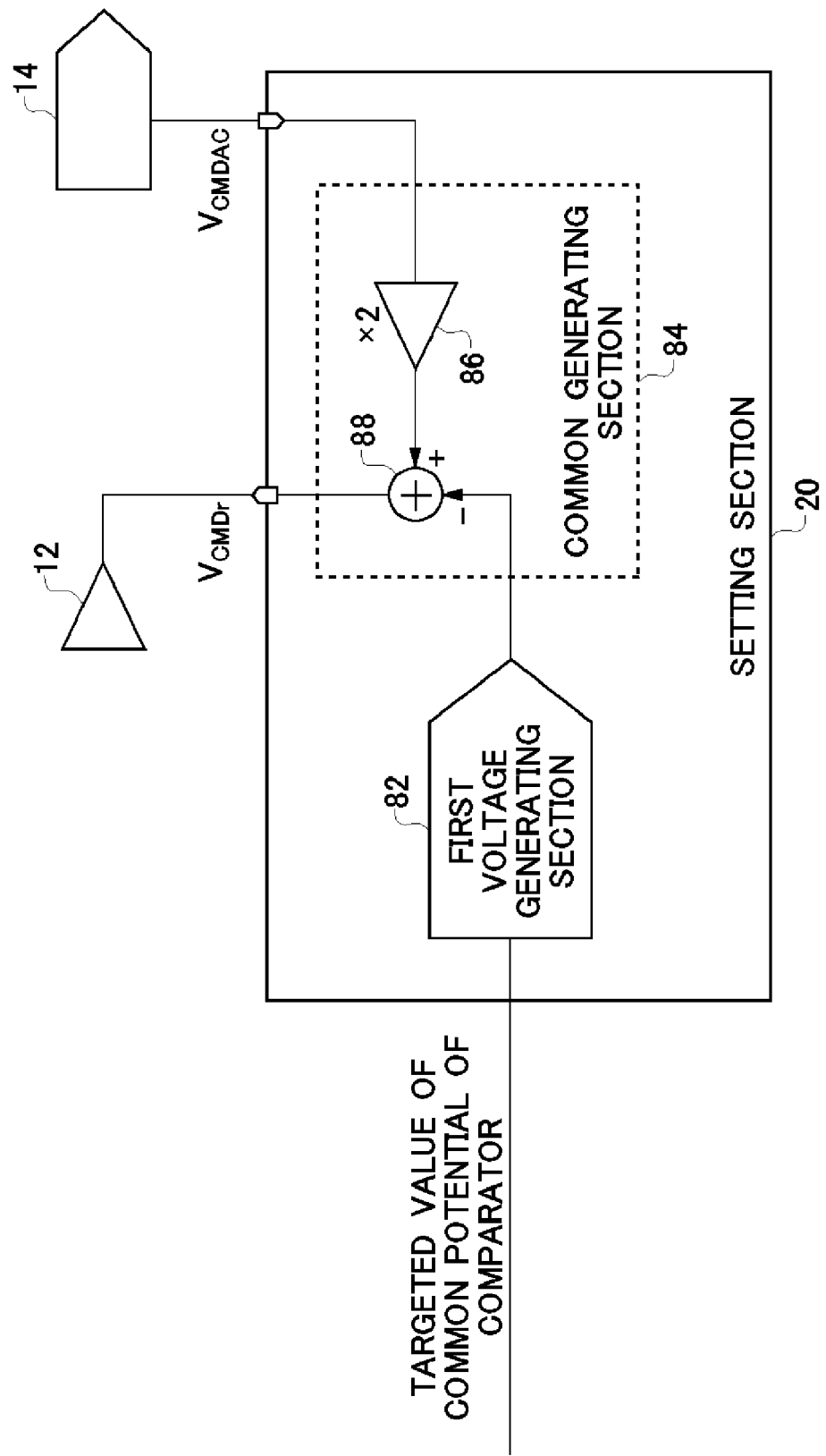
FIG. 7 shows a first example of a configuration of a setting section 20 according to the present embodiment.

FIG. 7 shows a first example of a configuration of a setting section 20 according to the present embodiment. The setting section 20 according to the first example includes a first voltage generating section 82 and a common generating section 84. The first voltage generating section 82 outputs a potential corresponding to the targeted value of the common potential of the comparator 16.

The common generating section 84 receives the common potential ($V_{CMDAC}$) of the differential DA converter 14, from the differential DA converter 14. The common generating section 84 generates the potential resulting from subtracting the potential generated from the first voltage generating section 82 from the twice the value of the common potential ($V_{CMDAC}$) of the differential DA converter 14, as the common potential ($V_{CMDr}$) of the differential amplifier 12.

For example, the common generating section 84 includes a doubling section 86, and a subtraction section 88. The doubling section 86 doubles the common potential ($V_{CMDAC}$) of the differential DA converter 14. The subtraction section 88 performs subtraction on the voltage outputted from the doubling section 86 and the voltage outputted from the first voltage generating section 82, and outputs the result as the common potential ($V_{CMDr}$) of the differential amplifier 12.

The explained setting section 20 in the first example can set the common potential ($V_{CMDr}$) of the differential amplifier 12, so that the common potential ($V_{CMcompin}$) of the comparator 16 is equal to the targeted value, based on the targeted values of the common potential ($V_{CMDAC}$) of the differential DA converter 14 and the common potential of the comparator 16 having been determined in advance. The stated setting section 20 can reduce the noise from the comparator 16, without changing the dynamic range of the differential DA converter 14.

Note that, when the differential amplifier 12 has a setting end for setting the common potential ($V_{CMDr}$) from outside, the setting section 20 provides the generated common potential ($V_{CMDr}$) of the differential amplifier 12 to this setting end. Instead of this arrangement, the setting section 20 may also set the common potential ($V_{CMDr}$) by controlling the current amount running thorough the current source of the differential amplifier 12 or the resistance value of the output resistance within the differential amplifier 12, for example.

Figure 8:
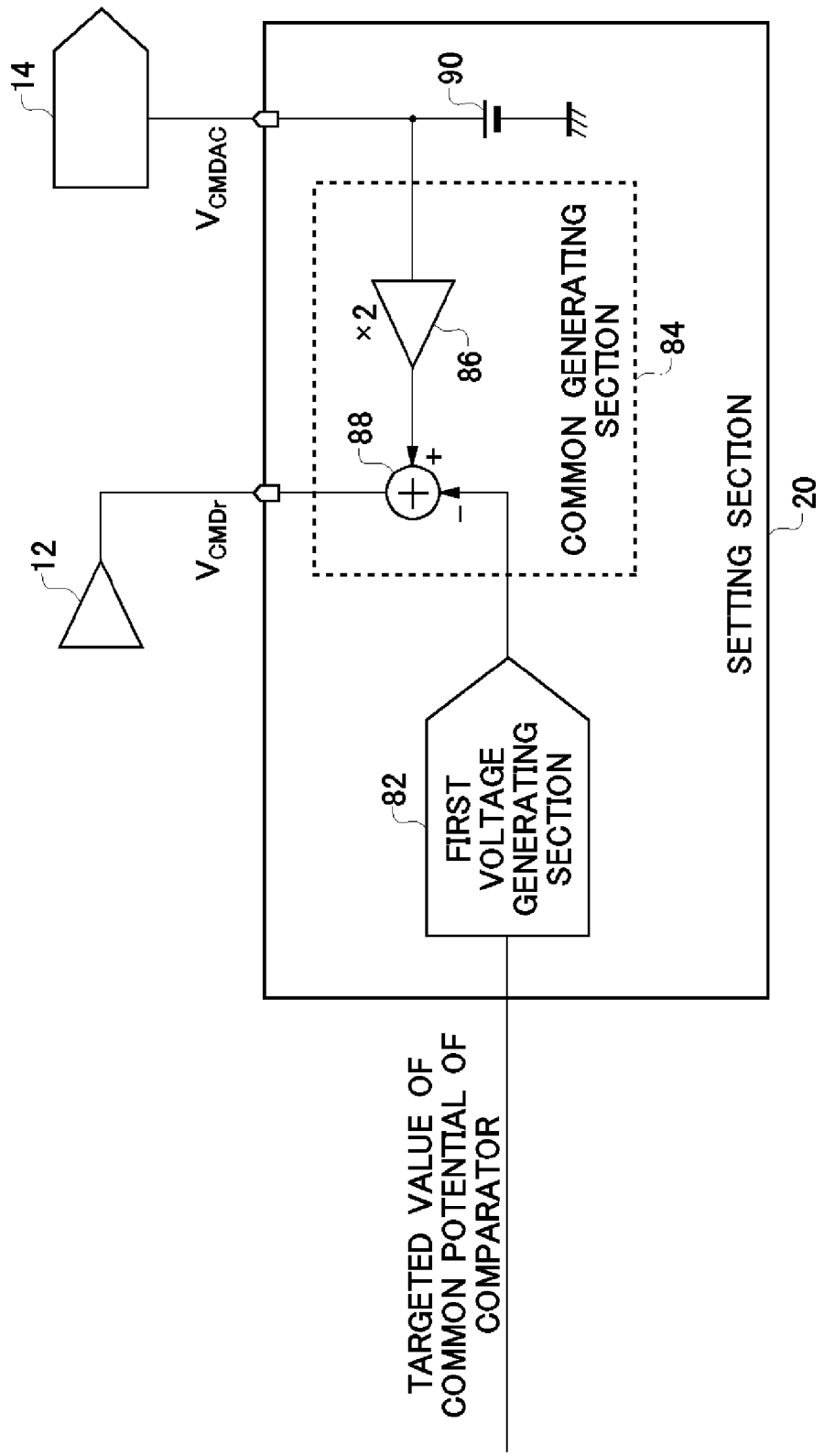
FIG. 8 shows a second example of the configuration of the setting section 20 according to the present embodiment.

FIG. 8 shows a second example of the configuration of the setting section 20 according to the present embodiment. Because the setting section 20 according to the second example has substantially the same configuration and function as those of the setting section 20 according to the first example shown in FIG. 7, the following explanation focuses on the differences.

The setting section 20 according to the second example further includes a second voltage generating section 90. The second voltage generating section 90 outputs the common potential ($V_{CMDAC}$) of the differential DA converter 14. The second voltage generating section 90 outputs the midpoint potential between the positive reference potential ($V_{REFP}$) and the negative reference potential ($V_{REFN}$), for example. Also in this modification example, the common generating section 84 receives the common potential ($V_{CMDAC}$) of the differential DA converter 14 outputted from the second voltage generating section 90, and causes it as the common potential ($V_{CMDr}$) of the differential amplifier 12.

The explained setting section 20 according to the second example can provide common potentials respectively to the differential amplifier 12 and the differential DA converter 14 independent from each other. According to this arrangement, the setting section 20 according to the second example can set the dynamic range of the differential DA converter 14 to an adequate range, as well as restraining the noise from the comparator 16.

Figure 9:
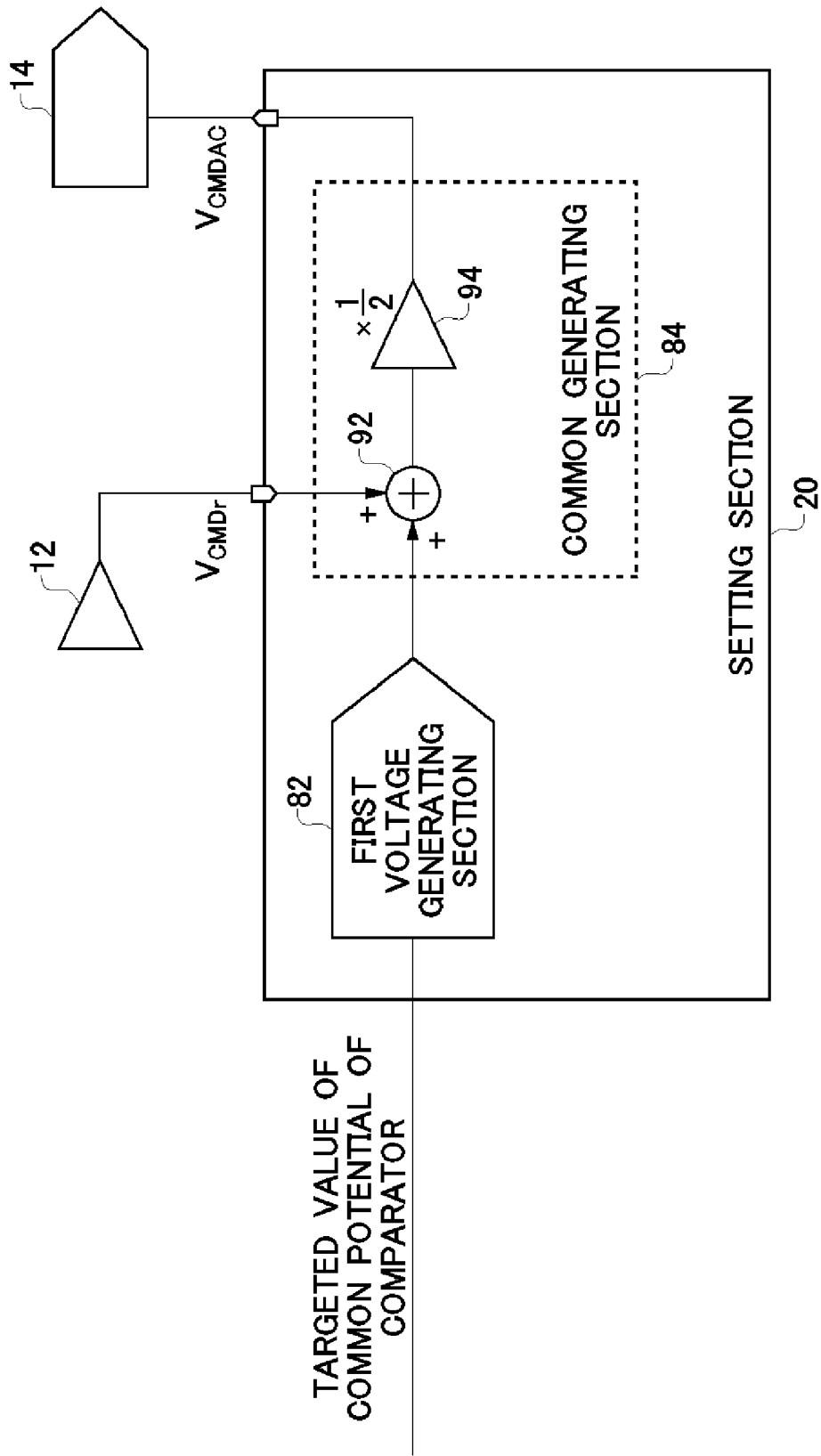
FIG. 9 shows a third example of the configuration of the setting section 20 according to the present embodiment.

FIG. 9 shows a third example of the configuration of the setting section 20 according to the present embodiment. Because the setting section 20 according to the third example has substantially the same configuration and function as those of the setting section 20 according to the first example shown in FIG. 7, the following explanation focuses on the differences.

The common generating section 84 according to the third example receives the common potential ($V_{CMDr}$) of the differential amplifier 12, from the differential amplifier 12. Then, the common generating section 84 generates ½ of the potential summation between the common potential ($V_{CMDr}$) of the differential amplifier 12 and the potential generated by the first voltage generating section 82, as the common potential ($V_{CMDAC}$) of the differential DA converter 14.

The common generating section 84 includes a halving section 92 and an addition section 94, for example. The halving section 92 adds the common potential ($V_{CMDr}$) of the differential amplifier 12 and the voltage outputted from the first voltage generating section 82. The addition section 94 halves the voltage outputted from the halving section 92, and outputs the result as the common potential ($V_{CMDAC}$) of the differential DA converter 14.

The explained setting section 20 in the third example can set the common potential ($V_{CMDAC}$) of the differential DA converter 14, so that the common potential ($V_{CMcompin}$) of the comparator 16 is equal to the targeted value, based on the targeted values of the common potential ($V_{CMDr}$) of the differential amplifier 12 and the common potential of the comparator 16 having been determined in advance. The stated setting section 20 can reduce the noise from the comparator 16, even when the common potential ($V_{CMDr}$) of the differential amplifier 12 cannot be changed for example.

Figure 10:
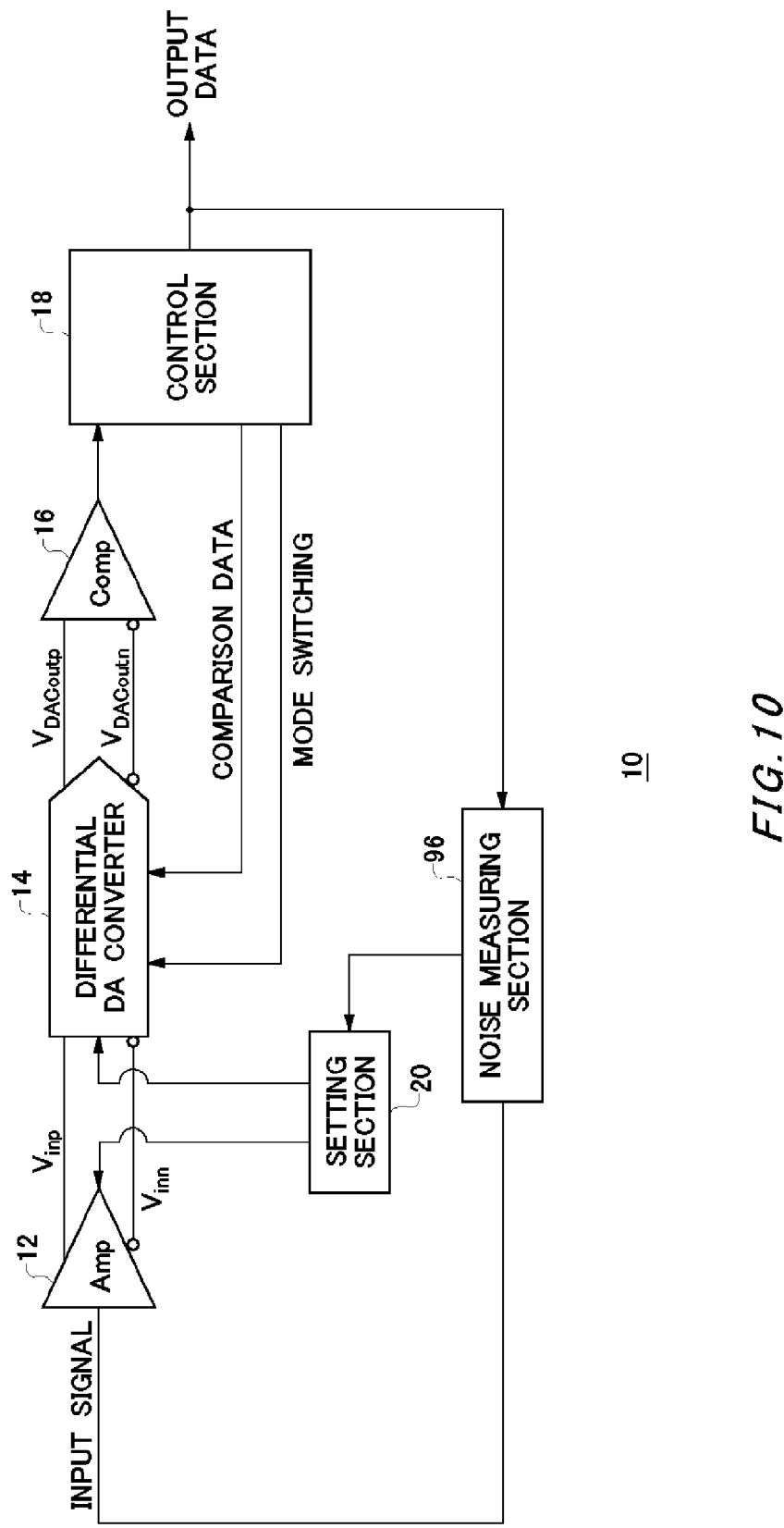
FIG. 10 shows a configuration of an AD conversion apparatus 10 according to a modification example of the present embodiment.

FIG. 10 shows a configuration of an AD conversion apparatus 10 according to a modification example of the present embodiment. Because the AD conversion apparatus 10 according to the present modification example has substantially the same configuration and function as those of the AD conversion apparatus 10 explained with reference to FIGS. 1-9, the following explanation focuses on the differences.

The AD conversion apparatus 10 according to the present modification example further includes a noise measuring section 96. The noise measuring section 96 measures the noise of the AD conversion apparatus 10 corresponding to the common potential ($V_{CMcompin}$) of the comparator 16. For example, the noise measuring section 96 measures the S/N ratio of the AD conversion apparatus 10, by changing the common potential ($V_{CMcompin}$) of the comparator 16, in such as calibration of the AD conversion apparatus 10.

The noise measuring section 96 detects the common potential ($V_{CMcompin}$) of the comparator 16, at which the noise of the AD conversion apparatus 10 gets smaller than a predetermined reference value. In this case, the noise measuring section 96 may detect the common potential ($V_{CMcompin}$) of the comparator 16, at which the noise of the AD conversion apparatus 10 becomes the smallest.

The setting section 20 receives, from the noise measuring section 96, the value of the common potential ($V_{CMcompin}$) of the comparator 16, at which the noise gets smaller than a predetermined reference value. Then, during operation of the AD conversion apparatus 10, the setting section 20 sets at least one of the common potential ($V_{CMDr}$) of the differential amplifier 12 and the common potential ($V_{CMDAC}$) of the differential DA converter 14, to cause the target value of the common potential ($V_{CMcompin}$) of the comparator 16, at which the noise gets smaller than a predetermined reference value.

The above-explained AD conversion apparatus 10 according to the modification example can reduce the noise from the comparator 16 and perform analog-digital conversion with accuracy, regardless of the usage environment or the differences in individual products and so on.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An AD conversion apparatus comprising:
   a differential amplifier that generates a differential input voltage according to an analog input signal;
   a differential DA converter of a charge redistribution type, which outputs a differential output voltage resulting from subtracting the differential input voltage from a differential comparison voltage that is in accordance with comparison data;
   a comparator that compares a positive output voltage and a negative output voltage in the differential output voltage;
   a control section that identifies the comparison data at which the differential output voltage becomes substantially 0 based on a comparison result of the comparator, and outputs the identified comparison data as output data; and
   a setting section that sets at least one of a common potential of the differential amplifier and a common potential of the differential DA converter, according to a targeted value of a common potential of the comparator, such that (a) the common potential of the differential amplifier is set independently of the common potential of the differential DA converter, (b) the common potential of the differential DA converter is set independently of the common potential of the differential amplifier, or (c) the common potential of the differential amplifier and the common potential of the differential DA converter are set independently of each other.

2. The AD conversion apparatus according to claim 1, wherein
the setting section sets at least one of the common potential of the differential amplifier and the common potential of the differential DA converter, to cause a targeted value of the common potential of the comparator at which noise is reduced than in a case of adopting the common potential of the differential DA converter.

3. An AD conversion apparatus comprising:
a differential amplifier that generates a differential input voltage according to an analog input signal;
a differential DA converter of a charge redistribution type, which outputs a differential output voltage resulting from subtracting the differential input voltage from a differential comparison voltage that is in accordance with comparison data;
a comparator that compares a positive output voltage and a negative output voltage in the differential output voltage;
a control section that identifies the comparison data at which the differential output voltage becomes substantially 0 based on a comparison result of the comparator, and outputs the identified comparison data as output data; and
a setting section that sets at least one of a common potential of the differential amplifier and a common potential of the differential DA converter, according to a targeted value of a common potential of the comparator, wherein
the setting section sets the common potential of the differential amplifier and the common potential of the differential DA converter, to be different potentials from each other.

4. The AD conversion apparatus according to claim 2, wherein
the setting section sets at least one of the common potential of the differential amplifier and the common potential of the differential DA converter, so that a potential resulting from subtracting the common potential of the differential amplifier from twice the common potential of the differential DA converter is equal to the targeted value of the common potential of the comparator.

5. The AD conversion apparatus according to claim 4, wherein
the setting section includes:
a first voltage generating section that outputs a potential corresponding to the targeted value of the common potential of the comparator; and
a common generating section that generates a potential resulting from subtracting the potential generated from the first voltage generating section from twice the common potential of the differential DA converter, as the common potential of the differential amplifier.

6. The AD conversion apparatus according to claim 5, wherein
the setting section further includes a second voltage generating section that outputs the common potential of the differential DA converter.

7. The AD conversion apparatus according to claim 4, wherein
the setting section includes:
a first voltage generating section that outputs a potential corresponding to the targeted value of the common potential of the comparator; and
a common generating section that generates ½ of a potential summation between the common potential of the differential amplifier and the potential generated from the first voltage generating section, as the common potential of the differential DA converter.

8. The AD conversion apparatus according to claim 1, further comprising:
a noise measuring section that measures noise of the AD conversion apparatus with respect to the common potential of the comparator, wherein
the setting section sets at least one of the common potential of the differential amplifier and the common potential of the differential DA converter, to cause a targeted value of the common potential of the comparator at which the noise is smaller than a predetermined reference value.

9. The AD conversion apparatus according to claim 1, wherein
the differential amplifier outputs, as the differential input voltage, a positive input voltage and a negative input voltage, the negative input voltage being an inverse of the positive input voltage with respect to the common potential of the differential amplifier, and
the differential DA converter (a) samples the positive input voltage and the negative input voltage in a sample mode, and (b) outputs a positive output voltage and a negative output voltage in a hold mode, the positive output voltage obtained by subtracting the positive input voltage from a positive comparison voltage that is in accordance with the comparison data, and the negative output voltage obtained by subtracting the negative input voltage from a negative comparison voltage that is in accordance with the comparison data.

10. The AD conversion apparatus according to claim 9, wherein
the differential DA converter includes:
a positive capacitor array connected to a positive output end;
a positive switch that switches connection of the positive capacitor array, according to control by the control section;
a negative capacitor array connected to a negative output end; and
a negative switch that switches connection of the negative capacitor array, according to control by the control section.

11. The AD conversion apparatus according to claim 10, wherein
in the sample mode, the differential DA converter charges the positive capacitor array with the positive input voltage by connecting the positive output end to a common potential, and charges the negative capacitor array with the negative input voltage by connecting the negative output end to a common potential, and
in the hold mode, the differential DA converter switches a ratio between (a) a capacity between the positive output end and the common potential and (b) a capacity between the positive output end and a positive reference potential, in the positive capacitor array, according to the comparison data, and switches a ratio between (c) a capacity between the negative output end and the common potential and (b) a capacity between the negative output end and a negative reference potential, in the negative capacitor array, according to the comparison data.

12. A control method of controlling an AD conversion apparatus that outputs output data according to an analog input signal, the AD conversion apparatus including: a differential amplifier that outputs a differential input voltage according to the analog input signal; a differential DA converter of a charge redistribution type, which outputs a differential output voltage resulting from subtracting the differential input voltage from a differential comparison voltage that is in accordance with comparison data; a comparator that compares a positive output voltage and a negative output voltage in the differential output voltage; and a control section that identifies the comparison data at which the differential output voltage becomes substantially 0 based on a comparison result of the comparator, and outputs the identified comparison data as output data; the control method comprising:

setting at least one of a common potential of the differential amplifier and a common potential of the differential DA converter, according to a targeted value of a common potential of the comparator, such that (a) the common potential of the differential amplifier is set independently of the common potential of the differential DA converter, (b) the common potential of the differential DA converter is set independently of the common potential of the differential amplifier, or (c) the common potential of the differential amplifier and the common potential of the differential DA converter are set independently of each other.

* * * * *